United States Patent
Shim et al.

(10) Patent No.: US 12,032,033 B2
(45) Date of Patent: Jul. 9, 2024

(54) BATTERY MANAGEMENT APPARATUS, BATTERY PACK, BATTERY SYSTEM, AND BATTERY MANAGEMENT METHOD

(71) Applicant: LG ENERGY SOLUTION, LTD., Seoul (KR)

(72) Inventors: Myung-Hyun Shim, Daejeon (KR); Sung-Yul Yoon, Daejeon (KR); Ki-Woong Kim, Daejeon (KR); Won-Kyung Kim, Daejeon (KR); Jeong-Bin Lee, Daejeon (KR); Jae-Sung Im, Daejeon (KR); Won-Bin Choi, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 139 days.

(21) Appl. No.: 17/909,911

(22) PCT Filed: Jul. 30, 2021

(86) PCT No.: PCT/KR2021/010016
§ 371 (c)(1),
(2) Date: Sep. 7, 2022

(87) PCT Pub. No.: WO2022/025725
PCT Pub. Date: Feb. 3, 2022

(65) Prior Publication Data
US 2023/0108798 A1    Apr. 6, 2023

(30) Foreign Application Priority Data

Jul. 31, 2020   (KR) .................. 10-2020-0096289

(51) Int. Cl.
*G01R 31/388*     (2019.01)
*G01R 19/165*     (2006.01)
(Continued)

(52) U.S. Cl.
CPC ....... *G01R 31/388* (2019.01); *G01R 19/1659* (2013.01); *G01R 19/30* (2013.01); *G01R 31/392* (2019.01); *G01R 31/396* (2019.01)

(58) Field of Classification Search
None
See application file for complete search history.

(56) References Cited

U.S. PATENT DOCUMENTS

| 2003/0006735 A1 | 1/2003 | Kawakami et al. |
| 2004/0001996 A1* | 1/2004 | Sugimoto ........... H01M 10/482 |
| | | 429/61 |

(Continued)

FOREIGN PATENT DOCUMENTS

| CN | 109613435 A | 4/2019 |
| JP | 11-224696 A | 8/1999 |

(Continued)

OTHER PUBLICATIONS

International Search Report for PCT/KR2021/010016 (PCT/ISA210) mailed on Nov. 25, 2021.

*Primary Examiner* — Jas A Sanghera
(74) *Attorney, Agent, or Firm* — Birch, Stewart, Kolasch & Birch, LLP

(57) ABSTRACT

A battery management apparatus according to the present disclosure includes a voltage measurement circuit to measure a cell voltage of each of a plurality of battery cells; and a control unit to determine the cell voltage of each of the plurality of battery cells and a reference voltage of the plurality of battery cells at a preset time interval during a rest period. The control unit determines a first accumulated change of the cell voltage of each battery cell during the rest period. The control unit determines a second accumulated change of the reference voltage during the rest period. The control unit determines whether each battery cell is defective (Continued)

by comparing the first accumulated change of each battery cell with the second accumulated change.

13 Claims, 6 Drawing Sheets

(51) Int. Cl.
    *G01R 19/30*     (2006.01)
    *G01R 31/392*     (2019.01)
    *G01R 31/396*     (2019.01)

(56) References Cited

U.S. PATENT DOCUMENTS

| | | | |
|---|---|---|---|
| 2012/0004873 A1* | 1/2012 | Li | G01R 31/36 320/134 |
| 2018/0136283 A1 | 5/2018 | Song et al. | |
| 2019/0242950 A1 | 8/2019 | Kishi | |
| 2020/0366115 A1 | 11/2020 | Kim et al. | |

FOREIGN PATENT DOCUMENTS

| | | |
|---|---|---|
| JP | 2002-334728 A | 11/2002 |
| JP | 2003-59544 A | 2/2003 |
| JP | 2003-243048 A | 8/2003 |
| JP | 2004-31120 A | 1/2004 |
| JP | 2005-322456 A | 11/2005 |
| JP | 2007-46942 A | 2/2007 |
| JP | 2009-145137 A | 7/2009 |
| JP | 2011-54413 A | 3/2011 |
| JP | 2013-160582 A | 8/2013 |
| JP | 2013-253857 A | 12/2013 |
| JP | 2015-125091 A | 7/2015 |
| JP | 2018-179684 A | 11/2018 |
| KR | 10-2014-0005799 A | 1/2014 |
| KR | 10-2018-0055123 A | 5/2018 |
| KR | 10-2018-0058040 A | 5/2018 |
| KR | 10-2018-0107958 A | 10/2018 |
| KR | 10-2020-0026128 A | 3/2020 |
| KR | 10-2020-0077238 A | 6/2020 |
| WO | WO 2018/012151 A1 | 1/2018 |

* cited by examiner

BATTERY MANAGEMENT APPARATUS, BATTERY PACK, BATTERY SYSTEM, AND BATTERY MANAGEMENT METHOD

TECHNICAL FIELD

The present disclosure relates to abnormality detection for battery cells.

The present application claims the benefit of Korean Patent Application No. 10-2020-0096289 filed on Jul. 31, 2020 with the Korean Intellectual Property Office, the disclosure of which is incorporated herein by reference in its entirety.

BACKGROUND ART

Recently, there has been a rapid increase in the demand for portable electronic products such as laptop computers, video cameras and mobile phones, and with the extensive development of electric vehicles, accumulators for energy storage, robots and satellites, many studies are being made on high performance batteries that can be repeatedly recharged.

Currently, commercially available batteries include nickel-cadmium batteries, nickel-hydrogen batteries, nickel-zinc batteries, lithium batteries and the like, and among them, lithium batteries have little or no memory effect, and thus they are gaining more attention than nickel-based batteries for their advantages that recharging can be done whenever it is convenient, the self-discharge rate is very low and the energy density is high.

Recently, with the widespread of battery systems (for example, energy storage systems, electric vehicles) requiring high voltage, there is a growing need for diagnosis technology for accurately detecting an abnormality in each of a plurality of battery cells connected in series in a battery pack.

When a battery cell instantaneously exhibits a large voltage drop beyond the threshold, the battery cell has been detected as defective. However, when the voltage of a battery cell slowly changes, it fails to properly detect an abnormality of the battery cell.

Meanwhile, polarization occurred during charging/discharging of a battery gradually reduces during the rest period. Accordingly, it is known that as polarization gradually reduces from the time point at which the charging/discharging of the battery is stopped, the voltage of the battery at rest gradually changes toward the Open Circuit Voltage (OCV) corresponding to the State Of Charge (SOC) of the battery. However, according to the cause of abnormality, during the rest period, a voltage change that is much larger than the common voltage change due to the reduced polarization may occur.

DISCLOSURE

Technical Problem

The present disclosure is designed to solve the above-described problem, and therefore the present disclosure is directed to providing a battery management apparatus, a battery pack, a battery system and a battery management method for detecting an abnormality of each battery cell based on a voltage history of each of a plurality of battery cells.

These and other objects and advantages of the present disclosure may be understood by the following description and will be apparent from the embodiments of the present disclosure. In addition, it will be readily understood that the objects and advantages of the present disclosure may be realized by the means set forth in the appended claims and a combination thereof.

Technical Solution

A battery management apparatus according to an aspect of the present disclosure includes a voltage measurement circuit configured to measure a cell voltage of each of a plurality of battery cells; and a control unit configured to determine the cell voltage of each of the plurality of battery cells and a reference voltage of the plurality of battery cells at a preset time interval during a rest period, determine a first accumulated change of the cell voltage of each battery cell during the rest period, determine a second accumulated change of the reference voltage during the rest period and determine whether each battery cell is defective by comparing the first accumulated change of each battery cell with the second accumulated change.

The control unit may be configured to determine the reference voltage to be equal to an average or median of the cell voltages of the plurality of battery cells.

The control unit may be configured to determine the first accumulated change of each battery cell by accumulating a change in the cell voltage of each battery cell at the preset time interval during the rest period.

The control unit may be configured to determine the second accumulated change of the reference voltage by accumulating a change in the reference voltage at the preset time interval during the rest period.

The control unit may be configured to determine an abnormality history indicating a time-series change of a difference between the first accumulated change of each battery cell and the second accumulated change at the preset time interval during the rest period. The control unit may be configured to determine whether each battery cell is defective based on a maximum value and a minimum value of the abnormality history associated with each battery cell.

The control unit may be configured to determine that each battery cell associated with the abnormality history in which the maximum value is larger than a first threshold and the minimum value is smaller than a second threshold is defective among the plurality of battery cells.

The control unit may be configured to determine that each battery cell associated with the abnormality history in which the maximum value is larger than the first threshold, the minimum value is smaller than the second threshold, and an absolute value of a slope between the maximum value and the minimum value is larger than a third threshold is defective among the plurality of battery cells.

A battery pack according to another aspect of the present disclosure includes the battery management apparatus.

A battery system according to still another aspect of the present disclosure includes the battery pack.

A battery management method according to yet another aspect of the present disclosure is performed at a preset time interval during a rest period of a plurality of battery cells. The battery management method includes determining a cell voltage of each of the plurality of battery cells and a reference voltage of the plurality of battery cells; determining a first accumulated change of the cell voltage of each battery cell during the rest period; determining a second accumulated change of the reference voltage during the rest period; and determining whether each of the plurality of battery cells is defective by comparing the first accumulated change of each battery cell with the second accumulated change.

Determining whether each of the plurality of battery cells is defective may include determining an abnormality history indicating a time-series change of a difference between the first accumulated change of each battery cell and the second accumulated change at the preset time interval during the rest period; and determining whether each battery cell is defective based on a maximum value and a minimum value of the abnormality history associated with each battery cell.

Determining whether each of the plurality of battery cells is defective may include determining that each battery cell associated with the abnormality history in which the maximum value is larger than a first threshold and the minimum value is smaller than a second threshold is defective among the plurality of battery cells.

Determining whether each of the plurality of battery cells is defective may include determining each battery cell associated with the abnormality history in which the maximum value is larger than a first threshold, the minimum value is smaller than a second threshold, and an absolute value of a slope between the maximum value and the minimum value is larger than a third threshold is defective among the plurality of battery cells.

Advantageous Effects

According to at least one of the embodiments of the present disclosure, it is possible to detect an abnormality of each battery cell based on a voltage history of each of a plurality of battery cells.

In particular, a battery cell exhibiting voltage behaviors that are distinctly different from the other battery cells among a plurality of battery cells may be determined to be defective by comparing a total change in cell voltage of each battery cell with a total change in reference voltage of the plurality of battery cells periodically during a rest period.

The effects of the present disclosure are not limited to the effects mentioned above, and these and other effects will be clearly understood by those skilled in the art from the appended claims.

DESCRIPTION OF DRAWINGS

The accompanying drawings illustrate a preferred embodiment of the present disclosure, and together with the detailed description of the present disclosure described below, serve to provide a further understanding of the technical aspects of the present disclosure, and thus the present disclosure should not be construed as being limited to the drawings.

BEST MODE

Figure 1:
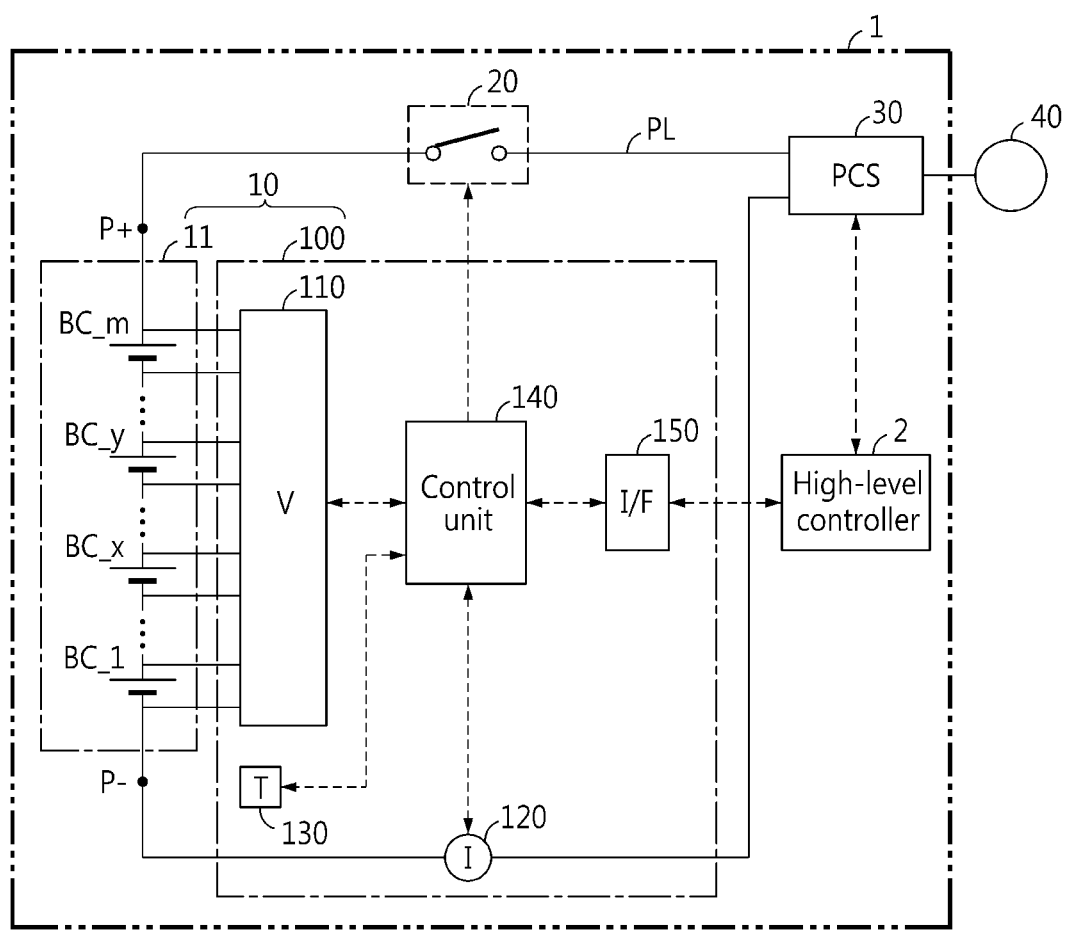
FIG. 1 is a diagram exemplarily showing a configuration of a battery system according to the present disclosure.

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but rather interpreted based on the meanings and concepts corresponding to the technical aspects of the present disclosure on the basis of the principle that the inventor is allowed to define the terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and modifications could have been made thereto at the time that the application was filed.

The terms including the ordinal number such as "first", "second" and the like, are used to distinguish one element from another among various elements, but not intended to limit the elements by the terms.

Unless the context clearly indicates otherwise, it will be understood that the term "comprises" when used in this specification, specifies the presence of stated elements, but does not preclude the presence or addition of one or more other elements. Additionally, the term "control unit" refers to a processing unit of at least one function or operation, and this may be implemented by hardware and software either alone or in combination.

In addition, throughout the specification, it will be further understood that when an element is referred to as being "connected to" another element, it can be directly connected to the other element or intervening elements may be present.

FIG. 1 is a diagram exemplarily showing a configuration of a battery system according to the present disclosure.

FIG. 1 shows an energy storage system as an example of the battery system 1. Referring to FIG. 1, the battery system 1 includes a battery pack 10, a switch 20 and a power conversion system 30. The battery system 1 is not limited to the energy storage system, and may include any battery system having a charging function and/or a discharging function of the battery pack 10 provided therein, such as an electric vehicle or a battery tester.

The battery pack 10 includes a positive terminal P+, a negative terminal P−, a cell group 11 and a battery management apparatus 100. The cell group 11 includes a plurality of battery cells BC_1~BC_m, m is a natural number of 2 or greater) electrically connected between the positive terminal P+ and the negative terminal P−. Although FIG. 1 shows the plurality of battery cells BC_1~BC_m connected in series, the plurality of battery cells BC_1~BC_m may be connected in parallel, or in series and in parallel. Hereinafter, in providing the description in common with the plurality of battery cells BC_1~BC_m, the reference sign 'BC' is used to refer to the battery cell.

The battery cell BC may include a positive electrode lead, a negative electrode lead, at least one positive electrode plate and at least one negative electrode plate. A positive electrode tab of each positive electrode plate may be coupled to the positive electrode lead, and a negative electrode tab of each negative electrode plate may be coupled to the negative electrode lead.

The positive electrode lead and the negative electrode lead of the battery cell BC are electrically coupled to another battery cell BC through a conductor such as a busbar. The battery cell BC may be a lithium ion battery cell. The battery cell BC is not limited to a particular type, and may include any type of battery cell that can be repeatedly recharged.

The switch 20 is installed on a power line PL for the battery pack 10. While the switch 20 is on, power transfer from any one of the battery pack 10 and the power conversion system 30 to the other is possible. The switch 20 may be implemented as at least one of well-known switching devices such as a relay and a Field Effect Transistor (FET). A control unit 140 may control the on/off of the switch 20 according to the state of the cell group 11.

The power conversion system 30 is operably coupled to the battery management apparatus 100 through a high-level controller 2. Operably coupled refers to directly/indirectly connected to transmit and receive a signal in one or two directions. The power conversion system 30 may produce the direct current power for the charge of the cell group 11 from the alternating current power supplied by an electrical grid 40. The power conversion system 30 may produce the alternating current power from the direct current power from the battery pack 10.

The battery management apparatus 100 includes a voltage measurement circuit 110 and the control unit 140. The battery management apparatus 100 may further include at least one of a current sensor 120, a temperature sensor 130 or an interface unit 150.

The voltage measurement circuit 110 is provided to be electrically connectable to the positive electrode lead and the negative electrode lead of the battery cell BC through a voltage sensing channel. The voltage measurement circuit 110 is configured to measure a cell voltage or a voltage across the battery cell BC, and output a signal indicating the measured cell voltage to the control unit 140. The control unit 140 may determine the cell voltage of each of the plurality of battery cells BC_1~BC_m at a preset time interval based on the signal from the voltage measurement circuit 110.

The current sensor 120 is electrically connected in series to the cell group 11 through the power line PL. For example, a shunt resistor or a hall effect device may be used as the current sensor 120. The current sensor 120 is configured to measure a current flowing through the cell group 11, and output a signal indicating the measured current to the control unit 140.

The temperature sensor 130 is disposed within a predetermined distance range from the cell group 11. For example, a thermocouple may be used as the temperature sensor 130. The temperature sensor 130 is configured to measure a temperature of the cell group 11, and output a signal indicating the measured temperature to the control unit 140.

The control unit 140 is operably coupled to the switch 20, the voltage measurement circuit 110, the current sensor 120, the temperature sensor 130 and/or the interface unit 150.

The control unit 140 may be implemented in hardware using at least one of application specific integrated circuits (ASICs), digital signal processors (DSPs), digital signal processing devices (DSPDs), programmable logic devices (PLDs), field programmable gate arrays (FPGAs), microprocessors or electrical units for performing the other functions.

The control unit 140 may have a memory embedded therein. The memory may pre-store programs and data necessary to perform battery management methods according to embodiments as described below. The memory may include, for example, at least one type of storage medium of flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM) or programmable read-only memory (PROM).

The interface unit 150 may be coupled to the high-level controller 2 of the battery system 1 to enable communication. The interface unit 150 may transmit a message from the high-level controller 2 to the control unit 140 and a message from the control unit 140 to the high-level controller 2. The message from the control unit 140 may include information for notifying an abnormality of the battery cell BC. The communication between the interface unit 150 and the high-level controller 2 may use, for example, a wired network such as a local area network (LAN), a controller area network (CAN) and a daisy chain and/or a near-field wireless network such as Bluetooth, Zigbee and Wi-Fi. The interface unit 150 may include an output device (for example, a display, a speaker) to provide the information received from the control unit 140 and/or the high-level controller 2 in a recognizable format. The high-level controller 2 may control the power conversion system 30 based on cell information (for example, voltage, current, temperature, SOC, abnormality of the battery cell) collected through communication with the battery management apparatus 100.

The control unit 140 may operate in a diagnosis mode in which a battery management method for detecting an abnormality of the battery cell BC as described below is performed, during at least some of a rest period. The starting time of the rest period is a time point at which the cell group 11 is switched from a use state (also known as a 'cycling state') to a rest state (also known as a 'rest mode' or 'calendar state'). The ending time of the rest period is a time point at which the cell group 11 is switched from the rest state to the use state. The rest state refers to a state in which the switch 20 is off and the current does not flow through the cell group 11, and the use state refers to a state other than the rest state. That is, in the rest state, the charge and discharge of the battery cell BC are all interrupted.

Figure 2:
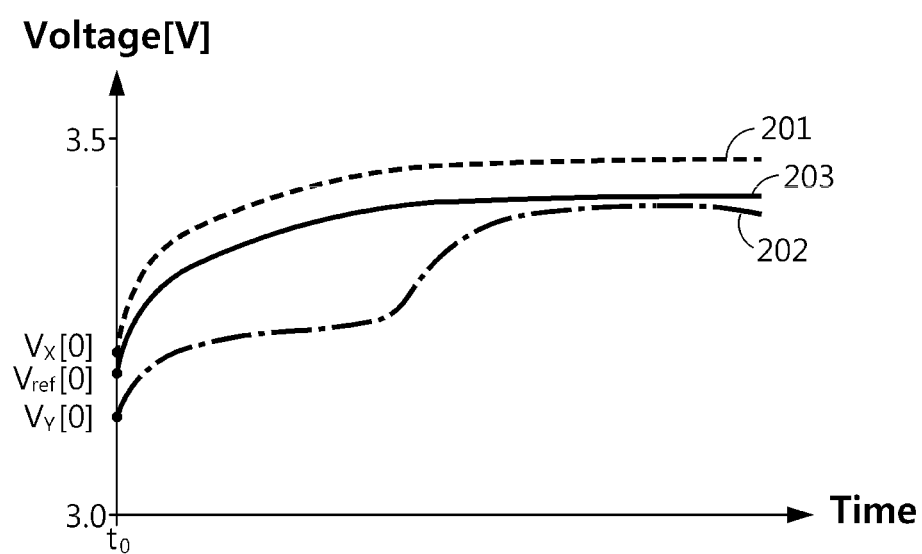
FIG. 2 is a graph referenced in describing a voltage history associated with each of a normal battery cell and a defective battery cell.
Figure 3:
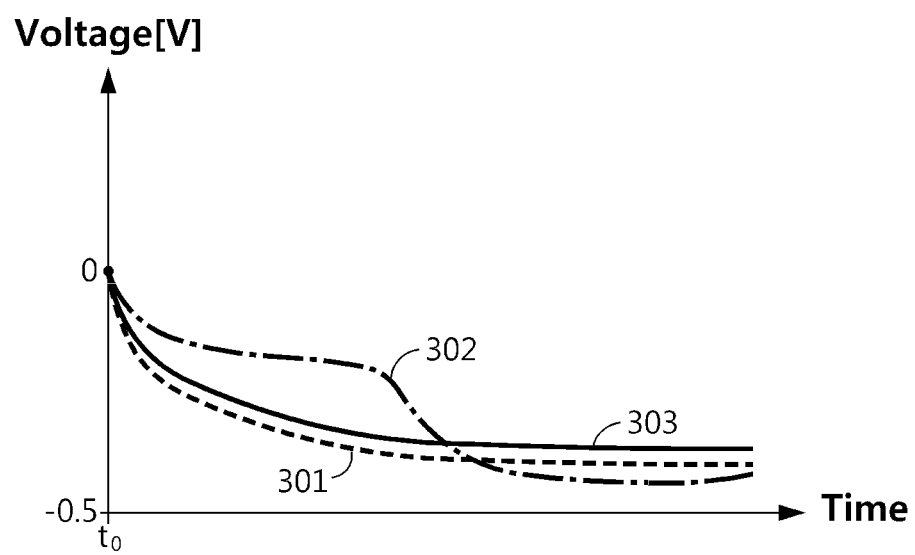
FIG. 3 is a graph referenced in setting an accumulated change associated with each of a normal battery cell and a defective battery cell.
Figure 4:
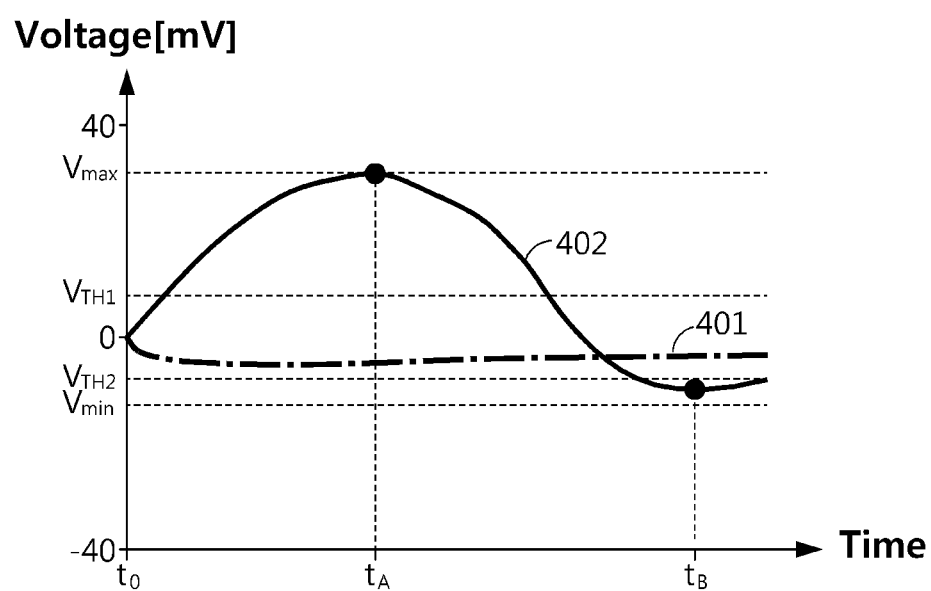
FIG. 4 is a graph referenced in describing an abnormality history associated with a battery cell.

FIG. 2 is a graph referenced in describing a voltage history associated with each of a normal battery cell and a defective battery cell, FIG. 3 is a graph referenced in setting an accumulated change associated with each of a normal battery cell and a defective battery cell, and FIG. 4 is a graph referenced in describing an abnormality history associated with a battery cell. In FIG. 2, a time point to refers to a time point at which the cell group 11 is switched from a discharging mode (or a charging mode) to the rest state, that is, the starting time of the rest period. Hereinafter, a description is provided under the assumption that the battery cell BC_x (1<x<y) of FIG. 1 is normal, and the battery cell BC_y (x<y<m) is defective.

Referring to FIG. 2, a curve 201 indicates a voltage history of the normal battery cell BC_x, a curve 202 indicates a voltage history of the defective battery cell BC_y, and a curve 203 indicates a reference voltage history. The voltage history of the battery cell BC refers to a time-dependent change in the cell voltage of the battery cell BC, i.e., a set of measured cell voltages (in time series).

In the specification, 'abnormality' to be diagnosed refers to an abnormal rise (or drop) of the cell voltage of the battery cell BC compared to other battery cell BC during the rest period. The abnormality may be caused by a defect in the tab of the battery cell BC. Specifically, the inventors discovered that as a result of analysis after disassembly of the battery cell BC that is found defective, damage (for example, a short circuit, a crack, tear) is found in some of the positive electrode tab(s) and/or the negative electrode tab(s) included in the battery cell BC. When a defect occurs in the tab, the resistance between the tab(s) and the lead(s) may be changed by a physical change (for example, swelling pressure) and/or transition of the electrical and chemical properties of the battery cell BC. The change in resistance affects the process of measuring the cell voltage by the voltage measurement circuit 110, and may be one of causes of the above-described abnormality.

The control unit 140 may determine the cell voltage of the battery cell BC at the preset time interval (for example, 0.01 sec) from the starting time $t_0$ of the rest period. In FIG. 2, $V_x[0]$, $V_y[0]$ and $V_{ref}[0]$ indicate the cell voltage of the battery cell BC_x, the cell voltage of the battery cell BC_y and the reference voltage at the starting time $t_0$. The control unit 140 may generate (update) cell voltage data based on the cell voltage of the battery cell BC. The cell voltage data may include information indicating the cell voltage of the battery cell BC, a first voltage change and a first accumulated change. That is, the control unit 140 may determine the cell voltage of the battery cell BC, the first voltage change and the first accumulated change at the preset time interval. The first voltage change indicates a change in the cell voltage of the battery cell BC at the preset time interval. For example, the first voltage change in the current cycle corresponds to (for example, is the same as) a difference between the cell voltage in the previous cycle and the cell voltage in the current cycle. The first accumulated change indicates a total change of the cell voltage of the battery cell BC from the starting time $t_0$ of the rest period to the current time. For example, the first accumulated change in the current cycle is the result of accumulating the first voltage change at the preset time interval during the rest period, and may correspond to (for example, the same as) a difference between the cell voltage at the starting time $t_0$ and the cell voltage in the current cycle.

The first accumulated change of the cell voltage of the battery cell BC may be represented as the following Equation 1.

$$\Delta V_{cell\_acc}[n] = \sum_{i=1}^{n}(V_{cell}[i-1] - V_{cell}[i]) = \sum_{i=1}^{n}\Delta V_{cell}[i] \quad \langle \text{Equation 1}\rangle$$

In Equation 1, n indicates the number of times the preset time has passed from the starting time $t_0$, $V_{cell}[i-1]$ indicates the $(i-1)^{th}$ measured cell voltage, $V_{cell}[i]$ indicates the $i^{th}$ measured cell voltage, $\Delta V_{cell}[i]$ indicates the $i^{th}$ determined first voltage change, and $\Delta V_{cell\_acc}[n]$ indicates the first accumulated change. $V_{cell}[0]$ may be the cell voltage at the starting time $t_0$. In addition, n is a time index corresponding to a time length from the starting time $t_0$ to the current time, and increases by 1 each time the preset time passes. For example, where the preset time=$\Delta t$, a total time period from the time point $t_0$ to the current time=$\Delta t \times n$, the current time=$t_0+(\Delta t \times n)$. Additionally, $V_{cell}[i]$ indicates the cell voltage of the battery cell BC measured at the time point $t_0+(\Delta t \times i)$.

As described above, the cell voltage data may be generated at the preset time interval for each of the plurality of battery cells BC_1~BC_m. The control unit 140 may generate reference voltage data of the plurality of battery cells BC_1~BC_m based on the cell voltage data generated for each of the plurality of battery cells BC_1~BC_m. The reference voltage data may include information indicating the reference voltage, a second voltage change and a second accumulated change.

The reference voltage may be determined to be equal to the average or median of the cell voltages of the plurality of battery cells BC_1~BC_m at the preset time interval. The second voltage change indicates a change in the reference voltage at the preset time interval. For example, the second voltage change in the current cycle corresponds to (for example, is the same as) a difference between the reference voltage in the previous cycle and the reference voltage in the current cycle. The curve 203 of FIG. 2 indicates a time-series change of the reference voltage. As can be seen from FIG. 2, the voltage history 201 of the normal battery cell BC_x roughly matches the curve 203. The second accumulated change indicates a total change of the reference voltage from the starting time $t_0$ of the rest period to the current time. For example, the second accumulated change in the current cycle is the result of accumulating the second voltage change at the preset time interval during the rest period, and may correspond to (for example, the same as) a difference between the reference voltage at the starting time $t_0$ and the reference voltage in the current cycle.

The second accumulated change of the reference voltage of the plurality of battery cells BC_1~BC_m may be represented as the following Equation 2.

$$\Delta V_{ref\_acc}[n] = \sum_{i=1}^{n}(V_{ref}[i-1] - V_{ref}[i]) = \sum_{i=1}^{n}\Delta V_{ref}[i] \quad \langle \text{Equation 2}\rangle$$

In Equation 2, n is the same as n of Equation 1, $V_{ref}[i-1]$ indicates the $(i-1)$th determined reference voltage, $V_{ref}[i]$ indicates the $i^{th}$ determined reference voltage, $\Delta V_{ref}[i]$ indicates the $i^{th}$ determined second voltage change, and $\Delta V_{ref\_acc}[n]$ indicates the second accumulated change.

Referring to FIG. 3, a curve 301 indicates a time-series change of the first accumulated change of the battery cell BC_x corresponding to the curve 201 of FIG. 2, a curve 302 indicates a time-series change of the first accumulated change of the battery cell BC_y corresponding to the curve 202 of FIG. 2, and a curve 303 indicates a time-series change of the second accumulated change of the reference voltage corresponding to the curve 203 of FIG. 2.

The control unit 140 may determine whether each of the plurality of battery cells BC_1~BC_m is defective by comparing each of the plurality of first accumulated changes with the second accumulated change. The plurality of first accumulated changes and the plurality of battery cells BC_1~BC_m are correlated to each other in a one-to-one relationship.

Specifically, the control unit 140 may determine (update) an abnormality history associated with the battery cell BC at the preset time interval by calculating a difference between the first accumulated change associated with the battery cell BC and the second accumulated change, and record the determined abnormality history in the memory. Accordingly, the plurality of abnormality histories correlated with the plurality of battery cells BC_1~BC_m in a one-to-one relationship may be updated at the preset time interval. The abnormality history associated with the battery cell BC indicates a difference between the first accumulated change of the cell voltage of the battery cell BC and the second accumulated change of the reference voltage, that is, a time-series change of ($\Delta V_{cell\_acc}[n]-\Delta V_{ref\_acc}[n]$) or ($\Delta V_{ref\_acc}[n]-\Delta V_{cell\_acc}[n]$).

The control unit 140 may determine each of a maximum value and a minimum value of the abnormality history associated with the battery cell BC at the preset time interval, and determine whether the battery cell BC is defective based on the maximum value and the minimum value. A curve 401 of FIG. 4 indicates the abnormality history of the battery cell BC_x corresponding to the curve 301 of FIG. 3, and a curve 402 indicates the abnormality history of the battery cell BC_y corresponding to the curve 302 of FIG. 3. Since the battery cell BC_x is normal, the cell voltage of the battery cell BC_x exhibits almost similar behaviors to the reference voltage during the rest period. That is, the curve 401 indicates that the abnormality history associated with the battery cell BC_x is only disposed within the voltage range defined by a first threshold $V_{TH1}$ and a second threshold $V_{TH2}$ over the entire rest period. The first threshold $V_{TH1}$ may be a positive value, and the second threshold $V_{TH2}$ may be a negative value. As opposed to the battery cell BC_x, since the battery cell BC_y is defective, the cell voltage of the battery cell BC_y is considerably inconsistent with the behaviors of the reference voltage during the rest period. That is, the curve 402 indicates that each of the maximum value $V_{max}$ and the minimum value $V_{min}$ of the abnormality history associated with the battery cell BC_y is larger than the first threshold $V_{TH1}$ and smaller than the second threshold $V_{TH2}$. The maximum value $V_{max}$ is a difference between the first accumulated change of the cell voltage of the battery cell BC_y and the second accumulated change of the reference voltage at the time point $t_A$, and the minimum value $V_{min}$ is a difference between the first accumulated change of the cell voltage of the battery cell BC_y and the second accumulated change of the reference voltage at the time point $t_B$.

The control unit 140 may determine that the battery cell (for example, BC_y) associated with the abnormality history in which the maximum value is larger than the first threshold $V_{TH1}$ and the minimum value is smaller than the second threshold $V_{TH2}$ is defective among the plurality of abnormality histories.

Alternatively, the control unit 140 may determine that the battery cell BC associated with each abnormality history in which the maximum value is larger than the first threshold Vim, the minimum value is smaller than the second threshold $V_{TH2}$, and an absolute value of a slope between the maximum value and the minimum value is larger than a third threshold is defective among the plurality of abnormality histories. Here, the slope between the maximum value and the minimum value is a value obtained by dividing a difference between the maximum value and the minimum value by a time interval between two time points at which the maximum value and the minimum value are detected. For example, in the curve 402, the slope between the maximum value $V_{max}$ and the minimum value $V_{min}$ is equal to ($V_{max}-V_{min}$)/($t_A-t_B$).

Each of the above-described thresholds may be preset according to the result of an experiment and/or simulation performed based on the total number of battery cells BC included in the cell group 11 and the specification of the battery cell BC.

Figure 5:
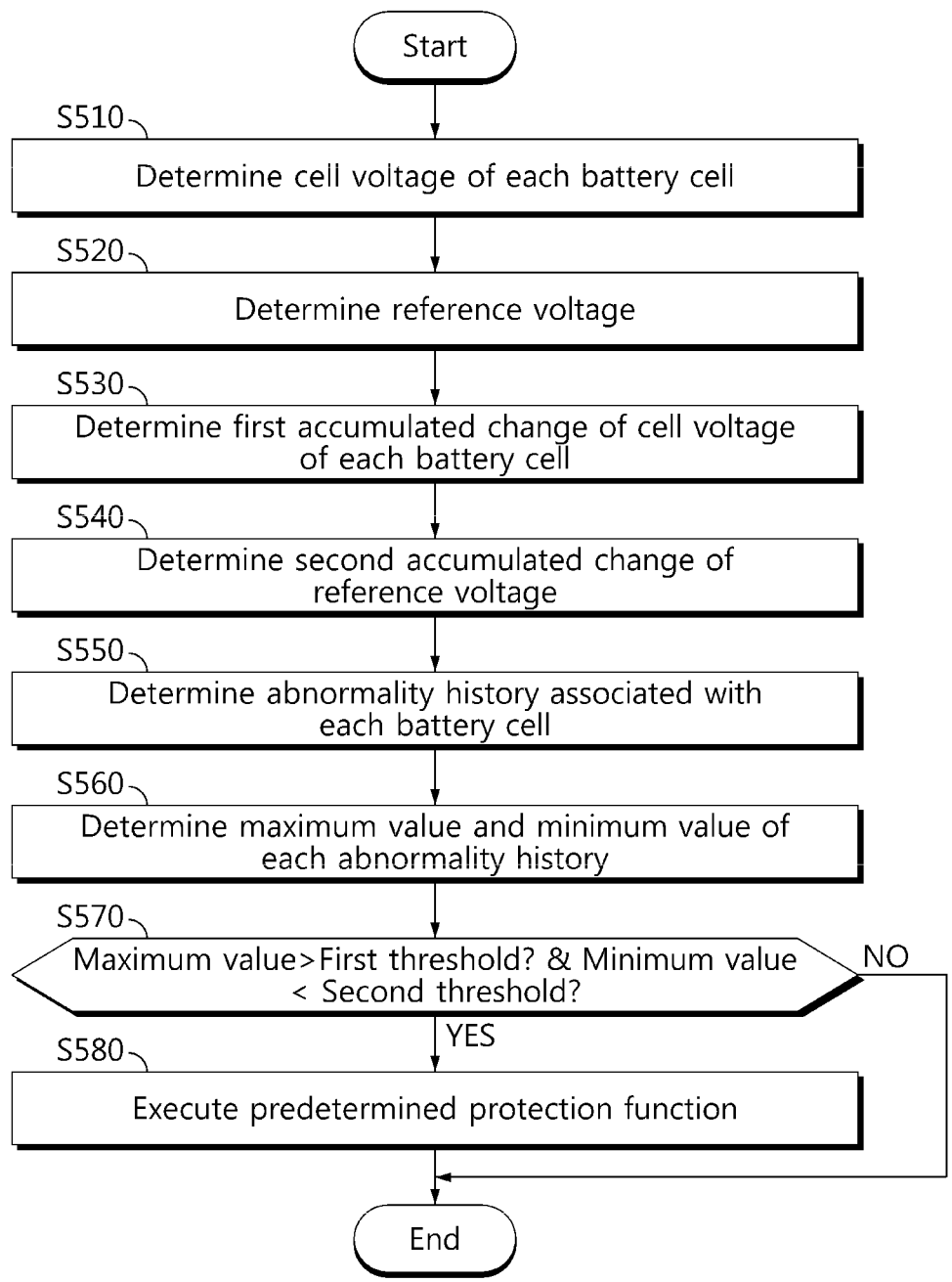
FIG. 5 is a flowchart exemplarily showing a battery management method according to a first embodiment of the present disclosure.

FIG. 5 is a flowchart exemplarily showing a battery management method according to a first embodiment of the present disclosure. The method of FIG. 5 may be repeated once at a preset time interval from the starting time $t_0$ of the rest period.

Referring to FIGS. 1 to 5, in step S510, the control unit 140 determines (measures) the cell voltage of each of the plurality of battery cells BC_1~BC_m included in the cell group 11 using the voltage measurement circuit 110.

In step S520, the control unit 140 determines the reference voltage of the plurality of battery cells BC_1~BC_m based on the cell voltage of each of the plurality of battery cells BC_1~BC_m. The reference voltage may be equal to the average or median of the cell voltages of the plurality of battery cells BC_1~BC_m.

In step S530, the control unit 140 determines the first accumulated change $\Delta V_{cell\_acc}[n]$ of the cell voltage of each of the plurality of battery cells BC_1~BC_m (see Equation 1).

In step S540, the control unit 140 determines the second accumulated change $\Delta V_{ref\_acc}[n]$ of the reference voltage (see Equation 2).

In step S550, the control unit 140 determines the plurality of abnormality histories respectively associated with the plurality of battery cells BC_1~BC_m, indicating a time-series change in difference between the first accumulated change of each of the plurality of battery cells BC_1~BC_m and the second accumulated change.

In step S560, the control unit 140 determines the maximum value and the minimum value of each of the plurality of abnormality histories.

In step S570, the control unit 140 determines whether the maximum value $V_{max}$ is larger than the threshold $V_{TH1}$ and the minimum value $V_{min}$ is smaller than the second threshold $V_{TH2}$ for each of the plurality of abnormality histories. For the battery cell BC_x, a value of the step S570 is "NO", whereas for the battery cell BC_y, the value of the step S570 may be "YES". When the value of the step S570 is "YES", the method moves to step S580. That is, the step S580 may be performed when at least one of the plurality of battery cells BC_1~BC_m is determined to be defective. When the value of the step S570 is "NO", the method may end.

In the step S580, the control unit 140 may perform a predetermined protection function. The protection function may include a function of outputting a diagnosis message. The diagnosis message may include identification information of the battery cell BC determined to be defective. The interface unit 150 may transmit the diagnosis message to the high-level controller 2, or output visual and/or audible information corresponding to the diagnosis message. The protection function may include a function of prohibiting the turn-on of the switch 20, i.e., a function of interrupting the switch from the rest state of the cell group 11 to the use state.

Figure 6:
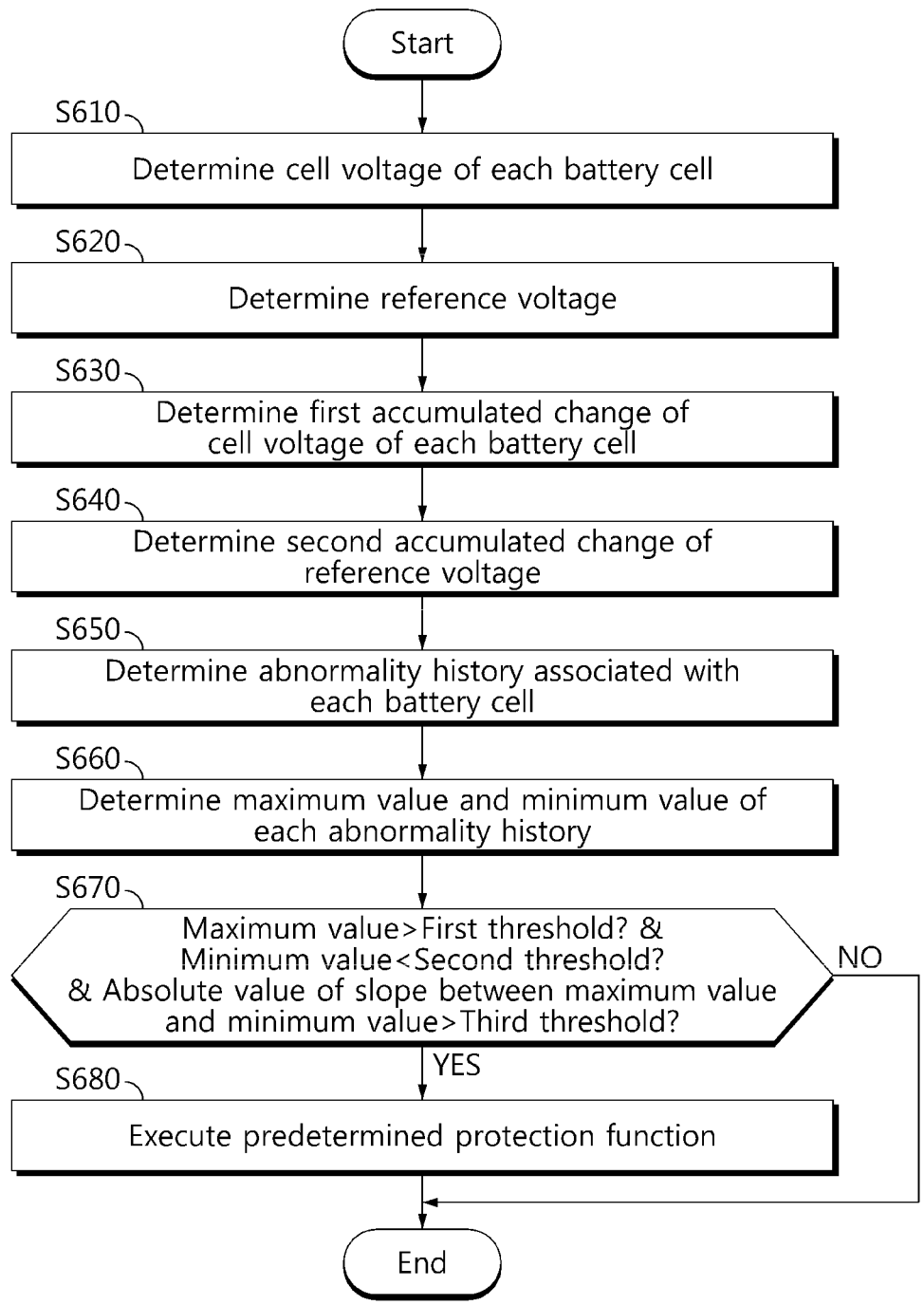
FIG. 6 is a flowchart exemplarily showing a battery management method according to a second embodiment of the present disclosure.

FIG. 6 is a flowchart exemplarily showing a battery management method according to a second embodiment of the present disclosure. The method of FIG. 6 may be repeated once at a preset time interval during the rest period. The steps S610 to S660 and S680 of FIG. 6 are in common with the steps S510 to S560 and S580 of FIG. 5, and the step S670 is a variation of the step S570. Accordingly, in describing the method of FIG. 6, the same description as the method of FIG. 5 may be omitted.

Referring to FIGS. 1 to 4 and 6, in step S610, the control unit 140 determines (measures) the cell voltage of each of the plurality of battery cells BC_1~BC_m.

In step S620, the control unit 140 determines the reference voltage of the plurality of battery cells BC_1~BC_m based on the cell voltage of each of the plurality of battery cells BC_1~BC_m.

In step S630, the control unit 140 determines the first accumulated change $\Delta V_{cell\_acc}[n]$ of the cell voltage of each of the plurality of battery cells BC_1~BC_m (see Equation 1).

In step S640, the control unit 140 determines the second accumulated change $\Delta V_{ref\_acc}[n]$ of the reference voltage (see Equation 2).

In step S650, the control unit 140 determines the plurality of abnormality histories associated with each of the plurality of battery cells BC_1~BC_m.

In step S660, the control unit 140 determines the maximum value and the minimum value of each of the plurality of abnormality histories.

In step S670, the control unit 140 determines whether the maximum value $V_{max}$ is larger than the threshold Vim, the minimum value $V_{min}$ is smaller than the second threshold $V_{TH2}$, and the absolute value of the slope between the maximum value and the minimum value is larger than the third threshold for each of the plurality of abnormality histories. When a value of the step S670 is "YES", the method moves to step S680. When the value of the step S670 is "NO", the method may end.

In the step S680, the control unit 140 may perform a predetermined protection function.

Meanwhile, with regard to the above-described polarization, polarization occurred in the normal battery cell tends to reduce rapidly at the early stage of the rest period. That is, in the rest period, the change rate of the cell voltage of the normal battery cell BC_x may slow down. Accordingly, the control unit 140 may be configured to perform the above-described diagnosis procedures from a reference time point at which a predetermined stabilization time (for example, 5 min) has passed from the starting time $t_0$, rather than performing the above-described diagnosis procedures immediately from the starting time $t_0$. In this case, the starting time $t_0$ described with reference to FIGS. 1 to 7 may be substituted by the reference time point.

The embodiments of the present disclosure described hereinabove are not implemented only through the apparatus and method, and may be implemented through programs that perform functions corresponding to the configurations of the embodiments of the present disclosure or recording media having the programs recorded thereon, and such implementation may be easily achieved by those skilled in the art from the disclosure of the embodiments previously described.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, as many substitutions, modifications and changes may be made to the present disclosure described hereinabove by those skilled in the art without departing from the technical aspects of the present disclosure, the present disclosure is not limited by the above-described embodiments and the accompanying drawings, and some or all of the embodiments may be selectively combined to allow various modifications.

What is claimed is:

1. A battery management apparatus, comprising:
   a voltage measurement circuit configured to measure a cell voltage of each of a plurality of battery cells; and
   a control unit configured to:
   determine the cell voltage of each of the plurality of battery cells and a reference voltage of the plurality of battery cells at a preset time interval during a rest period,
   determine a first accumulated change of the cell voltage of each battery cell during the rest period,
   determine a second accumulated change of the reference voltage during the rest period, and
   determine whether each battery cell is defective by comparing the first accumulated change of each battery cell with the second accumulated change.

2. The battery management apparatus according to claim 1, wherein the control unit is configured to determine the reference voltage to be equal to an average or median of the cell voltages of the plurality of battery cells.

3. The battery management apparatus according to claim 1, wherein the control unit is configured to determine the first accumulated change of each battery cell by accumulating a change in the cell voltage of each battery cell at the preset time interval during the rest period.

4. The battery management apparatus according to claim 1, wherein the control unit is configured to determine the second accumulated change of the reference voltage by accumulating a change in the reference voltage at the preset time interval during the rest period.

5. The battery management apparatus according to claim 1, wherein the control unit is configured to:
   determine an abnormality history indicating a time-series change of a difference between the first accumulated change of each battery cell and the second accumulated change at the preset time interval during the rest period, and
   determine whether each battery cell is defective based on a maximum value and a minimum value of the abnormality history associated with each battery cell.

6. The battery management apparatus according to claim 5, wherein the control unit is configured to determine that each battery cell associated with the abnormality history in which the maximum value is larger than a first threshold and the minimum value is smaller than a second threshold is defective among the plurality of battery cells.

7. The battery management apparatus according to claim 5, wherein the control unit is configured to determine that each battery cell associated with the abnormality history in which the maximum value is larger than the first threshold, the minimum value is smaller than the second threshold, and an absolute value of a slope between the maximum value and the minimum value is larger than a third threshold is defective among the plurality of battery cells.

8. A battery pack comprising the battery management apparatus according to claim 1.

9. A battery system comprising the battery pack according to claim 8.

10. A battery management method performed at a preset time interval during a rest period of a plurality of battery cells, the battery management method comprising:
    determining a cell voltage of each of the plurality of battery cells and a reference voltage of the plurality of battery cells;
    determining a first accumulated change of the cell voltage of each battery cell during the rest period;
    determining a second accumulated change of the reference voltage during the rest period; and
    determining whether each of the plurality of battery cells is defective by comparing the first accumulated change of each battery cell with the second accumulated change.

11. The battery management method according to claim 10, wherein determining whether each of the plurality of battery cells is defective includes:
- determining an abnormality history indicating a time-series change of a difference between the first accumulated change of each battery cell and the second accumulated change at the preset time interval during the rest period; and
- determining whether each battery cell is defective based on a maximum value and a minimum value of the abnormality history associated with each battery cell.

12. The battery management method according to claim 11, wherein determining whether each of the plurality of battery cells is defective includes determining that each battery cell associated with the abnormality history in which the maximum value is larger than a first threshold and the minimum value is smaller than a second threshold is defective among the plurality of battery cells.

13. The battery management method according to claim 11, wherein determining whether each of the plurality of battery cells is defective includes determining each battery cell associated with the abnormality history in which the maximum value is larger than a first threshold, the minimum value is smaller than a second threshold, and an absolute value of a slope between the maximum value and the minimum value is larger than a third threshold is defective among the plurality of battery cells.

* * * * *